(12) United States Patent
Nagai et al.

(10) Patent No.: US 7,521,702 B2
(45) Date of Patent: Apr. 21, 2009

(54) EXTREME ULTRAVIOLET LIGHT SOURCE AND EXTREME ULTRAVIOLET LIGHT SOURCE TARGET

(75) Inventors: Keiji Nagai, Suita (JP); Hiroaki Nishimura, Suita (JP); Takayoshi Norimatsu, Suita (JP); Katsunobu Nishihara, Suita (JP); Noriaki Miyanaga, Suita (JP); Masahiro Nakatsuka, Suita (JP); Yasukazu Izawa, Suita (JP); Tatsuhiko Yamanaka, Suita (JP); Mitsuo Nakai, Suita (JP); Keisuke Shigemori, Suita (JP); Masakatsu Murakami, Suita (JP); Yoshinori Shimada, Osaka (JP); Shigeaki Uchida, Osaka (JP); Hiroyuki Furukawa, Osaka (JP); Atsushi Sunahara, Osaka (JP); Vasilli Zhakhovski, Osaka (JP); Ryouji Matsui, Suita (JP); Takahiro Hibino, Suita (JP); Tomoharu Okuno, Suita (JP)

(73) Assignee: Osaka University, Osaka (JP)

( * ) Notice: Subject to any disclaimer, the term of this patent is extended or adjusted under 35 U.S.C. 154(b) by 185 days.

(21) Appl. No.: 10/550,800

(22) PCT Filed: Dec. 26, 2003

(86) PCT No.: PCT/JP03/16947
§ 371 (c)(1),
(2), (4) Date: Oct. 28, 2005

(87) PCT Pub. No.: WO2004/086467
PCT Pub. Date: Oct. 7, 2004

(65) Prior Publication Data
US 2006/0133574 A1      Jun. 22, 2006

(30) Foreign Application Priority Data
Mar. 26, 2003 (JP) ............................. 2003-085584

(51) Int. Cl.
*G03F 7/20* (2006.01)
*H05G 2/00* (2006.01)

(52) U.S. Cl. ................................. 250/504 R
(58) Field of Classification Search ................. 250/504, 250/492; 378/119
See application file for complete search history.

(56) References Cited

U.S. PATENT DOCUMENTS 4,917,960 A * 4/1990 Hornberger et al. ......... 428/550

(Continued)

FOREIGN PATENT DOCUMENTS

EP      1 324 371 A1      7/2003

OTHER PUBLICATIONS

Choi et al., "Detailed space-resolved characterization of a laser-plasma soft-x-ray source at 13.5-nm wavelength with tin and its oxides", Journal of th Optical Society of America, vol. 17, No. 9, Sep. 2000, pp. 1616-1625.*

*Primary Examiner*—Jack I Berman
(74) *Attorney, Agent, or Firm*—Oliff & Berridge, PLC

(57) ABSTRACT

An object of the present invention is to provide an extreme ultraviolet light source target which can emits extreme ultraviolet light with high emission efficiency. A solid target made of heavy metal or heavy-metal compound and having a density 0.5 to 80% that of the crystal density is used. When the target is irradiated with a laser beam, plasma of the heavy metal contained in the target is generated, and extreme ultraviolet light having a predetermined wavelength which corresponds to the kind of the heavy metal is emitted from the plasma. When the density of the target is made to be smaller than the crystal density as described above, space distribution of the density of the generated plasma can be controlled, and the region in which plasma absorbs energy of the laser beam overlaps the region in which the plasma emits the extreme ultraviolet light. Thus, emission efficiency can be improved, preventing energy loss. For example, in a case where the $SnO_2$ target having a density 24% of the crystal density is used, the emission efficiency at around 13.5 nm wavelength is higher than in the case where a Sn crystal target is used.

16 Claims, 5 Drawing Sheets

U.S. PATENT DOCUMENTS

| | | | |
|---|---|---|---|
| 5,409,683 A * | 4/1995 | Tillotson et al. | 423/338 |
| 5,577,092 A | 11/1996 | Kublak et al. | |
| 6,027,601 A | 2/2000 | Hanawa | |
| 6,158,384 A | 12/2000 | Ye et al. | |
| 6,181,069 B1 | 1/2001 | Tonotani et al. | |
| 6,320,937 B1 * | 11/2001 | Mochizuki | 378/143 |
| 6,323,595 B1 | 11/2001 | Tonotani et al. | |
| 6,355,821 B1 * | 3/2002 | Koplick et al. | 556/57 |
| 6,507,641 B1 | 1/2003 | Kondo et al. | |
| 6,647,088 B1 | 11/2003 | Schmidt et al. | |
| 2001/0008171 A1 | 7/2001 | Fukuda et al. | |

FOREIGN PATENT DOCUMENTS

| | | |
|---|---|---|
| JP | A-10-74597 | 3/1998 |
| JP | A 10-208998 | 8/1998 |
| JP | 11345698 A * | 12/1999 |
| JP | A 11-345698 | 12/1999 |
| JP | A 2001-68296 | 3/2001 |
| JP | A 2004-37364 | 2/2004 |
| WO | WO 97/16946 | 5/1997 |
| WO | WO 98/01893 | 1/1998 |
| WO | WO 00/19496 A1 | 4/2000 |
| WO | WO 01/30122 A1 | 4/2001 |
| WO | WO 01/31678 A1 | 5/2001 |

* cited by examiner

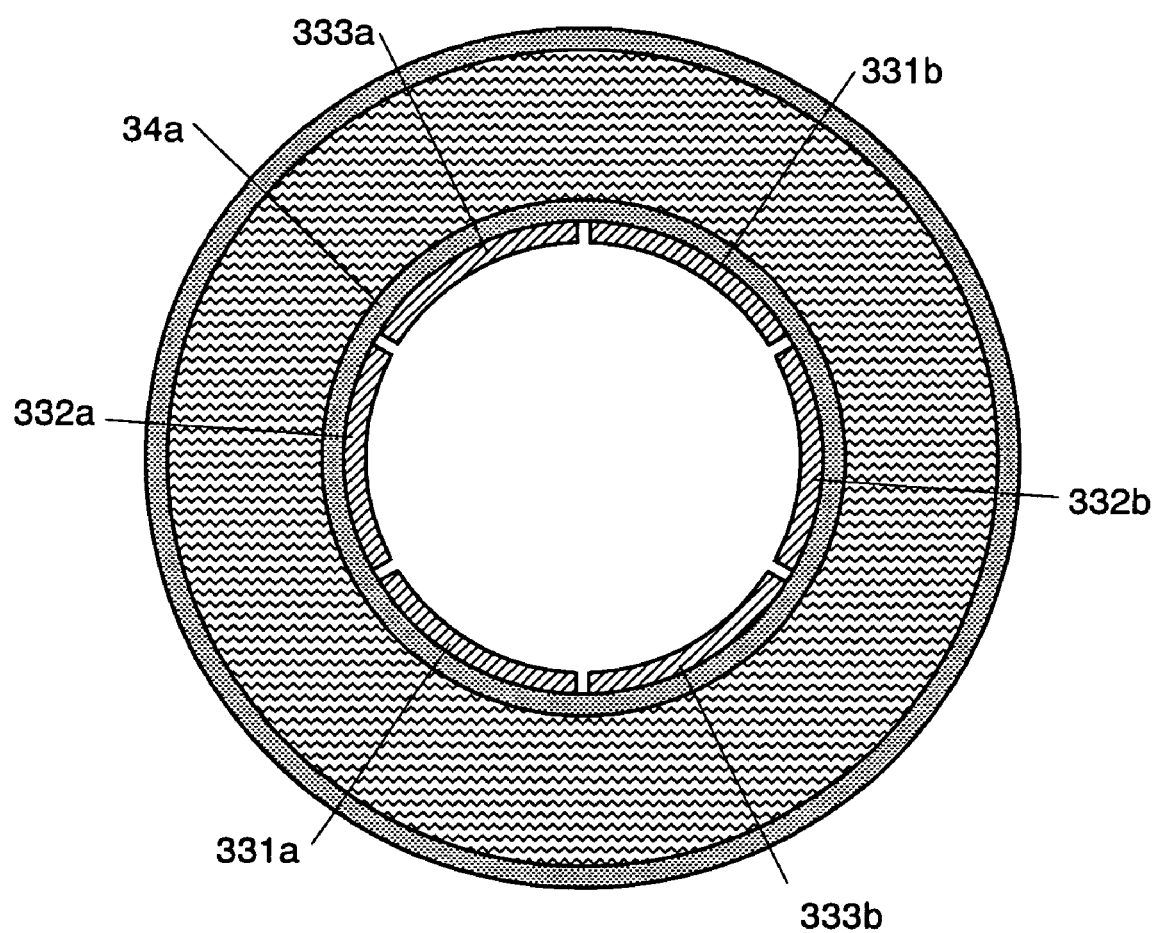

EXTREME ULTRAVIOLET LIGHT SOURCE AND EXTREME ULTRAVIOLET LIGHT SOURCE TARGET

TECHNICAL FIELD

The present invention relates to a target for generating extreme ultraviolet light having a wavelength of 1 to 100 nm, to a manufacturing method of the target, and to an extreme ultraviolet light source using the target. The target and the extreme ultraviolet light source can be used suitably in a lithographic process for manufacturing semiconductor devices.

BACKGROUND ART

Semiconductor integrated circuits are generally manufactured using a lithographic process. Since the minimum processing dimension of lithography depends on the wavelength of light used, it is necessary to shorten the wavelength of the irradiated light in order to improve the integration degree of the integrated circuit. Specifically, the lithographic process is, at present, performed using light having a wavelength of 157 to 365 nm. An object is to achieve the practical use of the lithography using extreme ultraviolet light having a wavelength of 11 to 14 nm.

For the light source of the extreme ultraviolet light, it is required that not only the light in the above wavelength region can be emitted, but also the light in the wavelength region can be selectively emitted (in other words, an emission in other wavelength regions is prevented), the light in the desired wavelength region can be emitted with high efficiency, and contaminating substances are not generated.

As a light source satisfying such conditions, a light source using a laser plasma method has been studied. According to the laser plasma method, a target is irradiated with a laser beam to form plasma, and extreme ultraviolet light emitted from the plasma is used. As the material of the target, materials in the form of gas, liquid, or solid, and made of various elements have been studied. Among them, as a gaseous target, one using xenon gas or the like is considered. A gaseous target is formed by injecting the gas into a predetermined region, and the gaseous target is used by irradiating the region with a laser beam. As a solid target, heavy metals or their compounds are considered. For example, a target made of a solid solution of 10% Th (thorium) in Sn (tin) matrix is disclosed in Japanese Unexamined Patent Publication No. 10-208998.

However, conventional targets have the following problem. The problem is described with reference to FIG. 1, in which the relation between a spatial position and an electron temperature in the vicinity of a surface of a conventional solid target is shown. Regarding a horizontal axis, the position of $1 \times 10^4$ μm corresponds to the position of a surface 15 of a solid target, and the position with a greater value in the horizontal axis corresponds to the inside of the target. The laser beam is irradiated toward the surface 15 of the target as shown by the arrow 13. In FIG. 1, the wavelength $\lambda_L$ of the laser beam is 1064 nm and the light intensity $I_L$ is $1 \times 10^{12}$ W/cm². The region shown by the reference numeral 11 in the drawing is a region in which the formed plasma absorbs energy of the laser beam (laser absorption region), and the region shown by the reference numeral 12 is a region in which the formed plasma emits extreme ultraviolet light (extreme ultraviolet light emission region). When the target is irradiated with the laser beam, the energy of the laser beam is absorbed in the laser absorption region 11, the energy is transported from the laser absorption region 11 to the extreme ultraviolet light emission region 12, and the extreme ultraviolet light is emitted from the extreme ultraviolet light emission region 12 owing to the transported energy. Here, while the energy is transported from the laser absorption region 11 to the extreme ultraviolet light emission region 12, a loss of the energy occurs. That is, a part of the absorbed energy is converted to heat, or the ratio of light in a region other than a desired wavelength increases, so that the emission spectrum has a broader distribution. As a result, the emission efficiency decreases.

In addition to that, when the solid or liquid target is irradiated with a laser beam, a part of the target turns into particles without generating any plasma, and the particles disperse from the target. When the dispersed particles (debris) fall on an optical system or the like, or damages the optical system or the like, the precision of the system could be lowered.

DISCLOSURE OF THE INVENTION

The present invention was made in order to solve the above problems and it is an object of the present invention to provide an extreme ultraviolet light source in which extreme ultraviolet light can be emitted with high emission efficiency, and in which the generation of debris is prevented, and to provide a target used in the extreme ultraviolet light source.

An extreme ultraviolet light source target according to the present invention made to solve the above problems is characterized in that the laser absorption region and the extreme ultraviolet light emission region are set closer in space by adjusting its density.

It is preferable that the laser absorption region and the extreme ultraviolet light emission region overlap in space.

According to the extreme ultraviolet light source target in the present invention, since the laser absorption region and the extreme ultraviolet light emission region are set closer in space, the loss of energy that is absorbed in the laser absorption region when the target is irradiated with the laser beam is reduced while the energy is transported to the extreme ultraviolet light emission region. Thus, the emission efficiency of the extreme ultraviolet light can be enhanced. Furthermore, when the laser absorption region and the extreme ultraviolet light emission region overlap in space, the intensity of irradiating laser, or the amount of input energy, can be minimized, and the emission efficiency of the extreme ultraviolet light can be further enhanced.

As a method of making the distance between the laser absorption region and the extreme ultraviolet light emission region smaller than before, or of making them overlap, the inventors of the present invention devised adjusting the density of the target. When the plasma is irradiated with the laser beam, the energy of the laser beam is absorbed in the plasma when the density of the plasma is within a predetermined range corresponding to the wavelength of the laser beam. The density of the plasma generated when the target is irradiated with the laser beam depends on the density of the target. Therefore, when the density of the target is appropriately adjusted, the region in which the plasma density is within the predetermined range, i.e. the laser absorption region, can be moved. Meanwhile, the extreme ultraviolet light is emitted in the region where the plasma is within a range of a predetermined electron temperature, and the predetermined electron temperature condition is not changed by a change in the density of the target. Therefore, by setting the density of the target appropriately, the laser absorption region and the extreme ultraviolet light emission region can be brought closer, or can overlap with each other.

According to the example shown in FIG. 1, the density of the target should be decreased in order to bring the laser absorption region 11 and the extreme ultraviolet light emission region 12 closer to each other. Owing to this, the density of the generated plasma is decreased, and the laser absorption region 11 is moved backward with respect to the direction of the laser irradiation, i.e. toward the surface 15. Meanwhile, the extreme ultraviolet light emission region 12, which is on the side of the surface 15 with respect to the laser absorption region 11, is not moved by the laser irradiation, as described above. Therefore, when the density of the target is decreased, the laser absorption region 11 approaches the extreme ultraviolet light emission region 12.

As a method of adjusting the density of the extreme ultraviolet light source target in order to bring the laser absorption region and the extreme ultraviolet light emission region closer, or to make them overlap, the following methods may be used, for example.

According to a first aspect, when the heavy metal or heavy-metal compound target is used, the density of the heavy metal or the heavy-metal compound is set so as to be 0.5% to 80% of the crystal density of the heavy metal or the compound thereof.

According to a second aspect, when a gas target is used, frost of the gas having a density 0.5% to 80% that of the solid density is generated, and the frosted gas is used as a target.

The extreme ultraviolet light source target according to the first aspect will be described in detail. The target is a solid target made of a heavy metal or a compound of heavy metal, and has a density smaller than their crystal density.

As the above heavy metal, it is preferable to use one among Ge (germanium), Zr (zirconium), Mo (molybdenum), Ag (silver), Sn (tin), La (lanthanum), Gd (gadolinium), and W (tungsten). In addition to those, their compounds such as a heavy-metal oxide, a heavy-metal complex, an organic heavy-metal compound may be used.

When the target is irradiated with the laser beam, the plasma of the heavy metal contained in the target is generated and extreme ultraviolet light having a predetermined wavelength corresponding to the kind of the heavy metal is emitted from the plasma. For example, when the heavy metal is Ge, the wavelength is 31.9 nm, when the heavy metal is Zr, the wavelength is 22.4 nm, when the heavy metal is Mo, the wavelength is 20.4 nm, when the heavy metal is Ag, the wavelength is 16.0 nm, when the heavy metal is Sn, the wavelength is 13.6 nm, when the heavy metal is La, the wavelength is 9.2 nm, when the heavy metal is Gd, the wavelength is 6.8 nm, and when the heavy metal is W, the wavelength is 5.0 nm.

According to this target, the laser absorption region and the extreme ultraviolet light emission region can be made closer than in the conventional target for the above reason. Thus, when the density of the target is 0.5 to 80% of the crystal density of the heavy metal or the heavy-metal compound, both region can overlap with each other.

For the target having the density of 0.5% to 80% of the crystal density of the heavy metal or compound thereof, a solid body of heavy metal or heavy-metal compound including voids, an aerogel body manufactured by a sol-gel method or the like is used.

FIG. 2 shows a graph showing the relation between a spatial position and an electron temperature in the vicinity of a target surface when a density of the target is set at 1%. The constitution of the horizontal axis, the irradiation direction 17 of a laser beam and the position of the target surface 18 are the same as those in FIG. 1. The wavelength $\lambda_L$ of the laser beam is 350 nm and the light intensity $I_L$ is $1 \times 10^{12}$ W/cm$^2$. The region 16 in FIG. 2 corresponds to the laser absorption region and the extreme ultraviolet light emission region, and the laser absorption region and the extreme ultraviolet light emission region overlap with each other.

As the density of the target is decreased, the target is prevented from dispersing as particles without generating plasma, or debris is prevented from being generated.

Next, the extreme ultraviolet light source target according to the second aspect will be described. This target is made of frost generated by the rapid cooling of a gas. Although an appropriate frost density varies since the number of electrons generated from one ion varies from element to element constituting the frost, the laser absorption region can approximately overlap the extreme ultraviolet light emission region when the density is set at 0.5% to 80% of its solid-state density.

Frost can be generated from any gas that has been conventionally used as targets, and its kind is not limited. For example, xenon, hydrogen, oxygen, nitrogen, argon, krypton and their mixture with hydrogen or helium can be used. The wavelength of the extreme ultraviolet light generated varies by the element used. For example, when the gas is xenon, its wavelength is 11 nm, 13, etc., when the gas is argon, its wavelength is 8 to 12 nm, 26 nm, etc., when the gas is krypton, its wavelength is 10 nm, etc., when the gas is nitrogen, its wavelength is 2 to 3 nm, etc., and when the gas is oxygen, its wavelength is 2 to 3 nm, etc.

An extreme ultraviolet light source using the extreme ultraviolet light source target according to the present invention comprises the target and a laser light source irradiating the target with a laser beam. As the laser light source, a YAG (yttrium, aluminum, garnet) laser light source or an excimer laser light source can preferably be used. The laser beam is not limited to a fundamental wave generated by the above laser light source, and it may be a harmonic wave thereof.

Since the extreme ultraviolet light source target according to the first aspect is solid at a normal temperature, it is not necessary to devise ways of fixing the target to the system of the extreme ultraviolet light source. Meanwhile, the extreme ultraviolet light source target according to the second aspect is generated at a low temperature and used at that temperature. Therefore, it is preferable that the extreme ultraviolet light source using the target according to the second aspect includes:

a) a hopper having an outlet from which frost can be discharged, b) a freezing machine for cooling the hopper, c) a heater capable of heating the wall of the hopper intermittently, and d) a vacuum chamber for keeping a circumference of the hopper in a vacuum state and having a first window for guiding a laser beam from the outside to the vicinity of the outlet, and a second window for taking out extreme ultraviolet light.

According to this system, after the hopper is cooled down to below the solidifying temperature of the material gas of the frost by the freezing machine, the gas is injected in the hopper, so that the gas is solidified on an inner wall surface of the hopper and attaches thereon. When the wall surface is heated by the heater in this state, the solidified material is sublimed and becomes high-density gas. When the heater is immediately turn off, the high-density gas is cooled quickly and becomes frost like snow. When the heater is intermittently turned on and off, frost is intermittently formed. The frost thus formed is deposited in the hopper and discharged from the hopper through the outlet. Although the frost is not continuously formed, when the frost is once deposited in the hopper, it can be continuously supplied outside the hopper. The laser beam is inputted from the first window and applied to the discharged frost. Thus, the extreme ultraviolet light can be generated. The extreme ultraviolet light can be taken out through the second window. In addition, the first window may be a lens so that it can also serve as a light collector.

When the heater works with the principle of high-frequency discharge (electrodeless glow discharge), the high-density gas is rapidly generated by the discharge and quickly cooled when the discharge is stopped, which is preferable for the generation of the frost. In this case, when a plurality of discharge electrodes of the heater are provided, a solidified layer can be formed by stopping the discharge of a certain pair of discharge electrodes while the high-density gas is generated by the discharge of another pair of discharge electrodes. Thus, the frost can be continuously generated, which is preferable.

It is preferable that this system further comprises a bladed wheel rotatably fixed to the hopper just above the outlet and having a plurality of blades which radiate outward, and the hopper is formed cylindrically just above the outlet so as to surround the bladed wheel. In this constitution, an appropriate amount of the frost is discharged from the hopper in accordance with rotation of the bladed wheel. In addition, when a rotation axis of the bladed wheel is hollowed and the cooling material passes through it, it is preferable because sublimation of the frost is prevented.

BRIEF DESCRIPTION OF THE DRAWINGS

FIG. 7 is a sectional view taken along line A-A in FIG. 6.

BEST MODE FOR CARRYING OUT THE INVENTION

First, a description will be made of a target containing $SnO_2$ (tin dioxide) which is a heavy-metal compound (referred to as a low-density $SnO_2$ target hereinafter) as an embodiment of an extreme ultraviolet light source target according a first aspect.

A first manufacturing method of the low-density $SnO_2$ target according to the present invention will be described. First, 1.0 g of $SnCl_4$ (tin tetrachloride) is added to 20 g of dehydrated methanol (which does not contain water, an impurity), and stirred. Thus, a methanol solution of tin (IV) methoxide, in which tin (IV) is substituted for the hydroxyl of methanol, is provided. Pure water 50 ml is mixed with this solution. Thus, there is provided a gel containing $SnO_2$ in which tin (IV) methoxide is hydrolyzed. This gel is dried after being coated on a glass substrate so that the low-density $SnO_2$ target which is 100 μm in thickness and 0.05 g/cm$^3$ in density is provided. The density of the target is 0.7% of the density (6.95 g/cm$^3$) of $SnO_2$ crystal.

Instead of the glass substrate, a tape-shaped thin film made of polyethylene terephthalate or the like may be used as the substrate. In this case, a tape-shaped low-density $SnO_2$ target can be provided. When this tape-shaped target is used, the tape can easily be moved. Thus, as a new surface can be exposed to the laser irradiation position at any time, the light source can be continuously operated. When the low-density $SnO_2$ target is formed on a disk-shaped substrate or on a cylindrical substrate, and the disk-shaped or the cylindrical target is rotated and irradiated with a laser beam, the light source can be continuously operated like the tape-shaped target.

Figure 1:
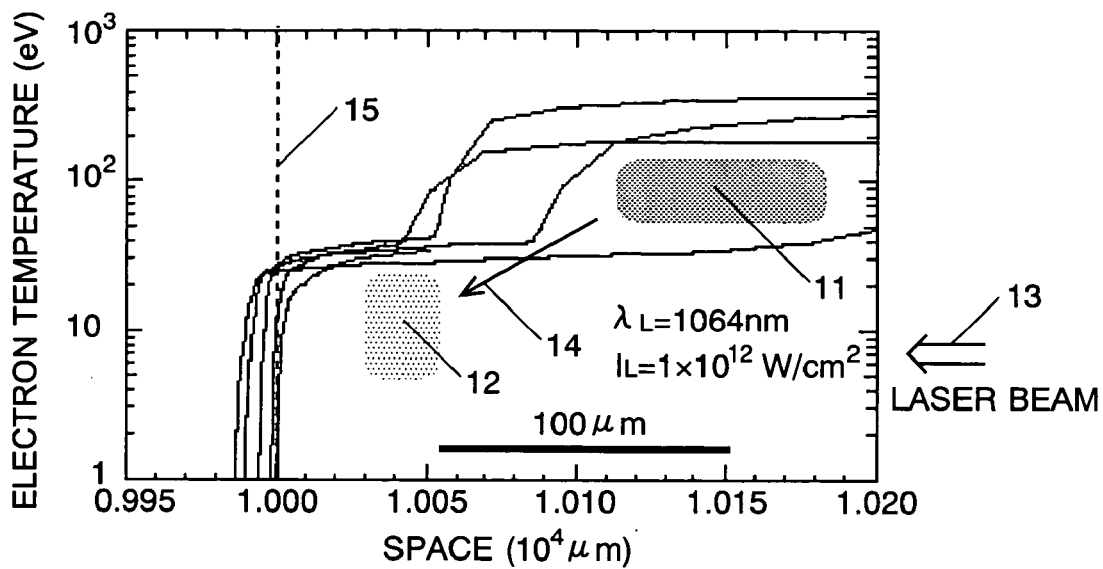
FIG. 1 is a graph showing a relation between a laser absorption region and an extreme ultraviolet light emission region in a conventional target.
Figure 2:
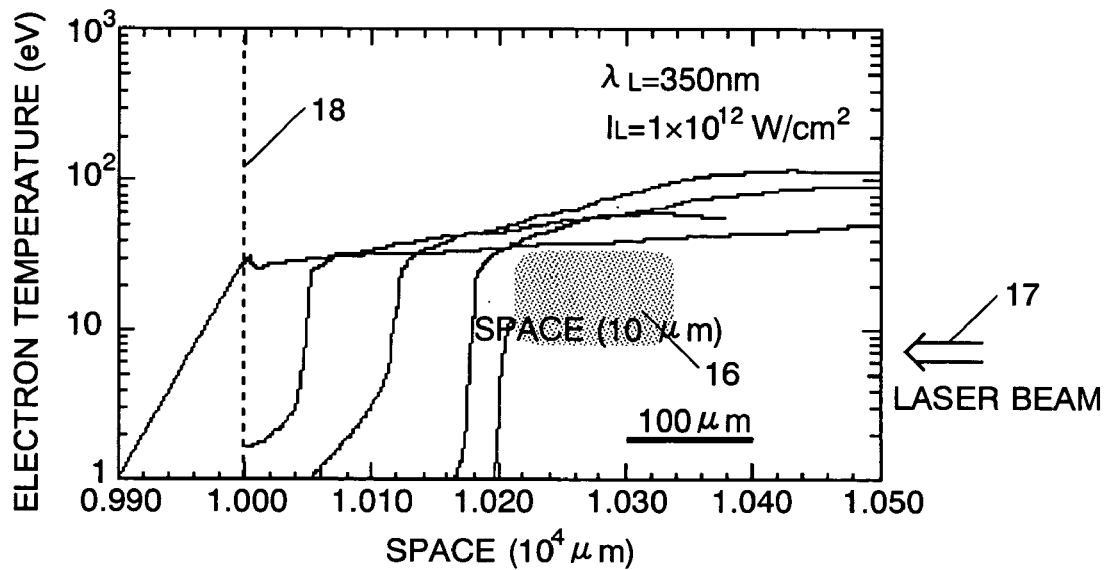
FIG. 2 is a graph showing a relation between a laser absorption region and an extreme ultraviolet light emission region in an extreme ultraviolet light source target according to the present invention.
Figure 3:
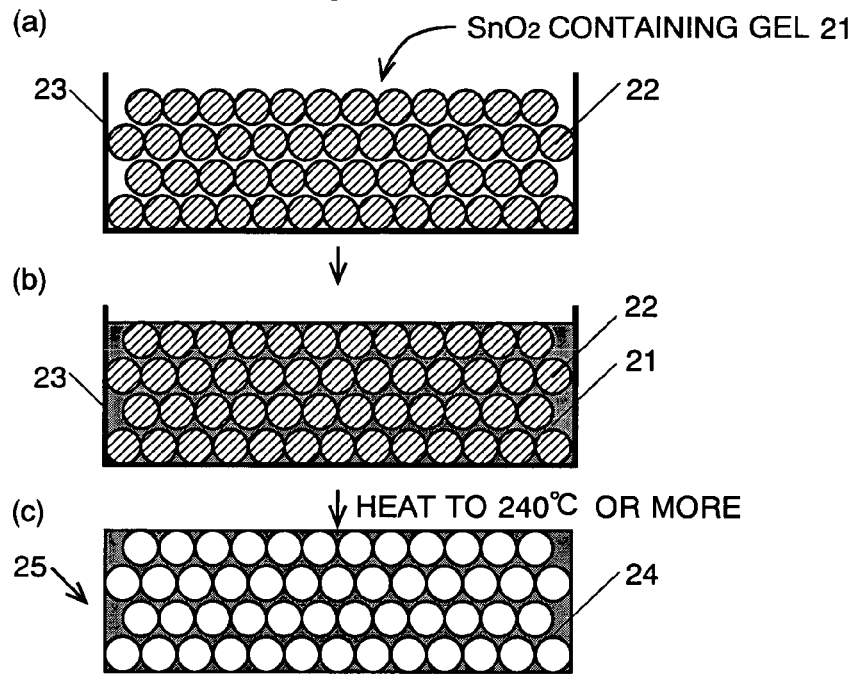
FIG. 3 is a vertical sectional view showing a second manufacturing method of a low-density $SnO_2$ target which is one embodiment of an extreme ultraviolet light source target according to a first aspect of the present invention.

A second manufacturing method of the low-density $SnO_2$ target will be described with reference to FIG. 3. Similar to the first manufacturing method, after $SnCl_4$ of 1.0 g is added to dehydrated methanol of 20 g and stirred, pure water of 50 ml is mixed with this, and a gel 21 containing $SnO_2$ is provided. Then, this gel 21 containing $SnO_2$ is put in a container 23 filled with nanoparticles of polystyrene 22, and the gel 21 containing $SnO_2$ and the nanoparticles of polystyrene 22 are mixed. Here, a nanoparticle of polystyrene 22 is a minute polystyrene particle whose diameter is several μm. When this is heated to 240° C., the polystyrene nanoparticles evaporate and only $SnO_2$ 24 is left (c). Thus, the low-density $SnO_2$ target whose density is 24% of crystal $SnO_2$ is provided.

Though the dehydrated methanol was used in the above embodiment, other dehydrated alcohol such as dehydrated ethanol may be used. In addition, a low-density target made of a heavy-metal oxide other than $SnO_2$ can be manufactured by the same method as the above.

The density of the heavy-metal oxide of the target manufactured by the above manufacturing methods can be 0.5% to 80% of the heavy-metal oxide crystal by appropriately setting the amount of raw materials of heavy-metal chloride, alcohol, and water.

According to the second manufacturing method, the temperature to heat the mixture of the gel 21 containing $SnO_2$ and polystyrene nanoparticles 22 is set to be not lower than 240° C., which is the lower limit temperature at which the polystyrene nanoparticles 22 evaporate, but not higher than the decomposition temperature of the heavy-metal oxide.

Figure 4:
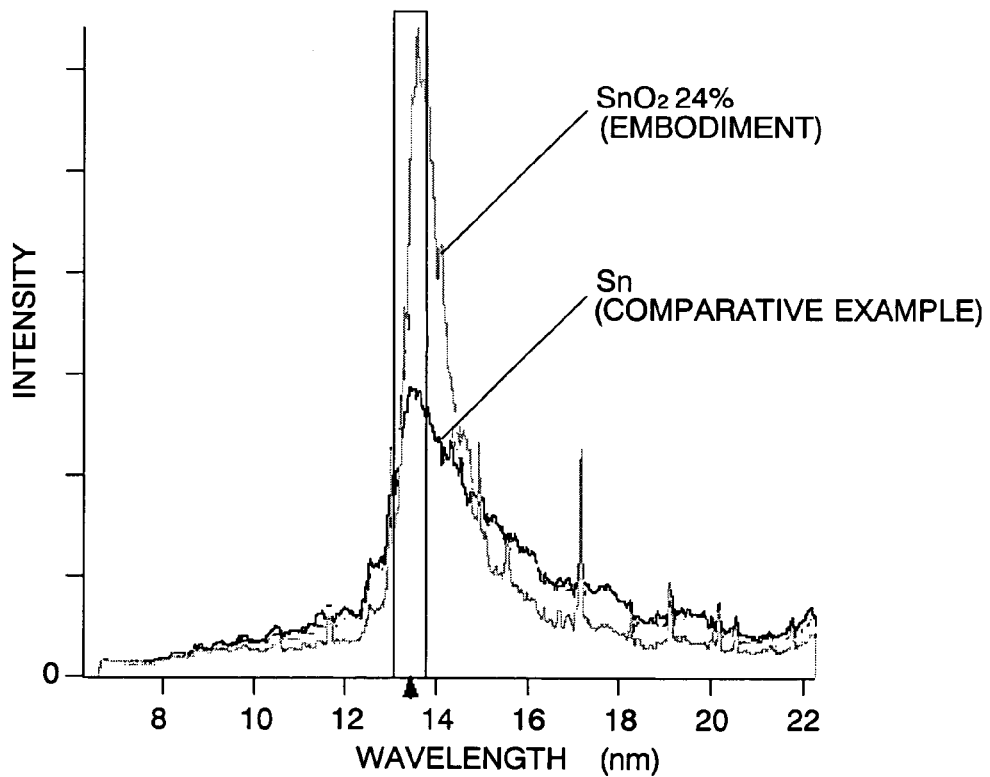
FIG. 4 is a graph showing one example of an emission spectrum of extreme ultraviolet light provided using the low-density $SnO_2$ target.

FIG. 4 shows an example of an emission spectrum of extreme ultraviolet light provided using the extreme ultraviolet light source target (density: 24% that of $SnO_2$ crystal) manufactured by the second manufacturing method. This emission spectrum is provided when the low-density $SnO_2$ target manufactured by the second manufacturing method is irradiated with a laser beam of a third harmonic wave (wavelength is 350 nm) provided from a Nd—YAG laser light source. For comparison, a spectrum provided by irradiating a target made of Sn and having a density of 100% with the same laser beam is shown together.

In lithography used in manufacturing a semiconductor device, it is necessary to provide extreme ultraviolet light having high intensity in a region of a wavelength of 13 to 14 nm. Although the spectrums provided in this embodiment and a comparison example have a peak in the vicinity of the wavelength 13.5 nm which is within the above wavelength range, peak intensity is higher in the embodiment than that in the comparison example. Increase in this peak intensity is because intensity of the emission itself is increased by using the low-density target as compared with the conventional target and because a peak configuration is sharper so that a ratio of the emission in the above wavelength region is increased.

Figure 5:
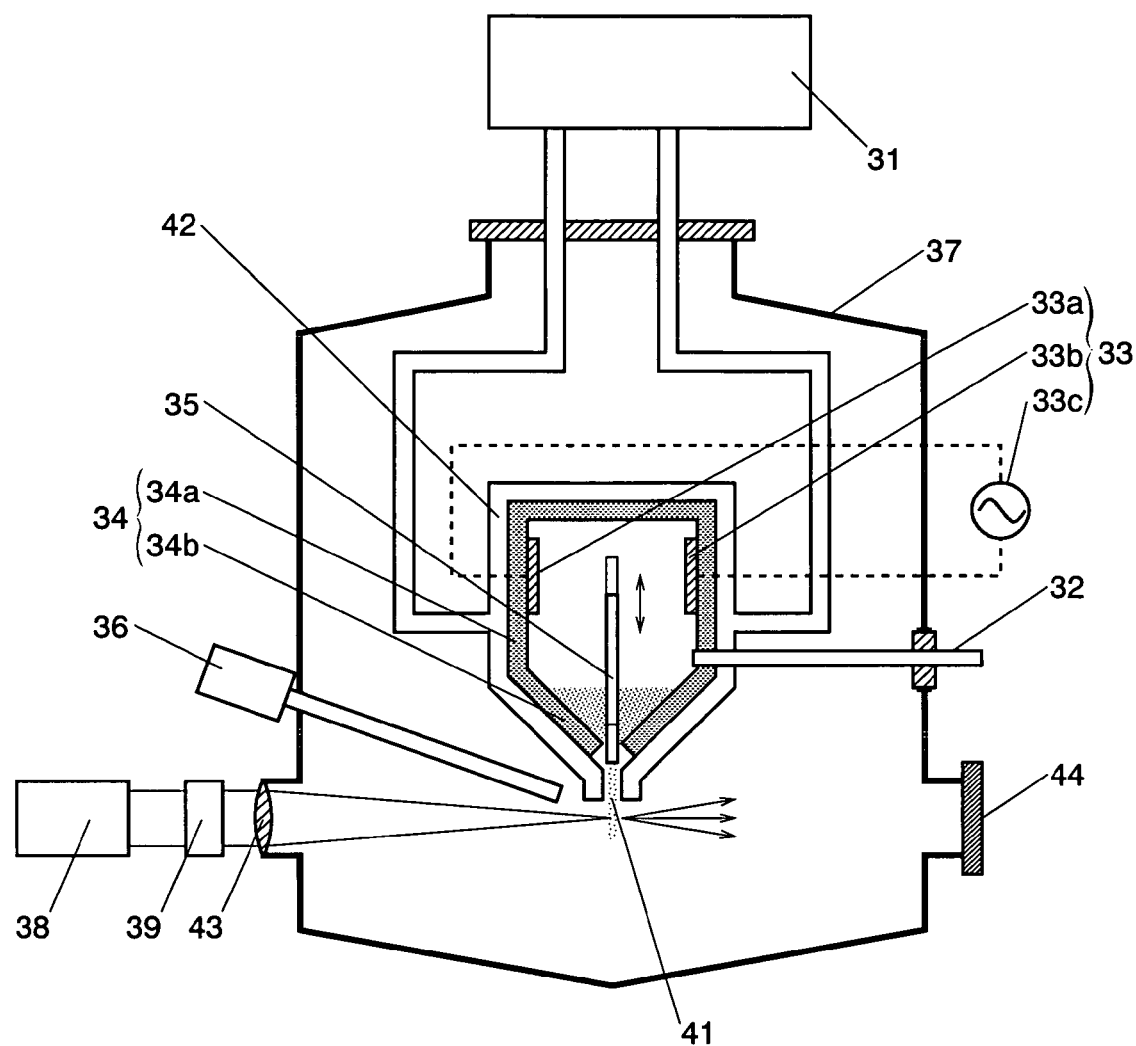
FIG. 5 is a vertical sectional view showing a first embodiment of an extreme ultraviolet light source using an extreme ultraviolet light source target according to a second aspect of the present invention.

Next, a description will be made of a first embodiment of an extreme ultraviolet light generating system using a target made of frost according to a second aspect. FIG. 5 is a vertical sectional view showing the extreme ultraviolet light source system according to this embodiment. The system comprises a freezing machine 31, a gas injection pipe 32, a heater 33, a hopper 34, a push-out rod 35, a monitor 36, a vacuum chamber 37, a high-output pulse laser beam generator 38, and a wavelength converter 39.

The hopper 34 is fixed in the vacuum chamber 37 and comprises a cylindrical body part 34*a* of an upper part and a conical guide part 34*b* of a lower part. Both body part 34*a* and guide part 34*b* are made of an insulating material such as a glass, a ceramics and the like. An outlet 41 through which the frost is discharged is provided at a lower end of the hopper 34. In addition, a pipe 42 in which a cooling medium such as liquid helium circulates along a wall surface is provided around the hopper 34. The pipe 42 penetrates the vacuum chamber air-tightly and it is connected to the freezing machine 31. The heater 33 is for high-frequency discharge in principle and comprises a pair of discharge electrodes 33*a* and 33*b* and a high-frequency power source 33*c*. The discharge electrodes 33*a* and 33*b* are provided on the inner wall surface of the body part 34*a*. The discharge electrodes may be provided on the outer wall surface depending on the thickness or a material of the wall. The push-out rod 35 stands perpendicularly in the hopper 34 and it is set so as to be vertically movable by a remote control from the outside of the vacuum chamber 37.

A first window 43 equipped with a lens is provided in a wall surface of the vacuum chamber 37 at the same level as the outlet 41, and a second window 44 is provided opposite to the first window 43. Outside the vacuum chamber 37, the wavelength converter 39 and the laser beam generator 38 are connected to the first window 43 in this order. The gas injection pipe 32 penetrates a side face of the vacuum chamber and the body part 34*a* air-tightly in order to inject gas from outside into the hopper 34. The monitor 36 also penetrates the vacuum chamber 37, and an end of the monitor 36 is brought close to the outlet 41.

The lens constituting the first window 43 is arranged so that its focal point is positioned just under the outlet 41, and serves also as a light collector. Therefore, a pulse laser beam generated by the laser beam generator 38 is converted to a harmonic wave by the wavelength converter 39 so as to be highly absorbed by the frost, refracted by the first window 43 and collected just under the outlet 41.

An operation of the system in this embodiment will be described taking a case where xenon Xe is a target as an example. First, the freezing machine 31 is started to cool the hopper to 161 K or lower at which Xe will be solidified at a normal pressure. Then, when Xe gas is injected from the gas injection pipe 32 into the hopper 34, a solidified layer of Xe is formed on the internal surface of the hopper 34. Then, high-frequency discharging is performed between the discharge electrodes 33*a* and 33*b* by the high-frequency power source 33*c*, and the surface of the solidified layer formed on the internal wall of the hopper 34 is selectively heated to generate vapor. When the high-frequency discharging is instantaneously stopped, the gas of the vapor is cooled quickly and become frost. The frost is deposited on the guide part 34*b* of the hopper 34. When this is pushed out from the outlet 41 by the push-out rod 35, a rod-shaped target is formed.

The target has the atomic density of $2 \times 10^{20}$ to $8 \times 10^{21}/cm^3$ at a temperature lower than the temperature of the triple point temperature in which a solid phase, a liquid phase and a gas phase coexist, and under a temperature condition and a density condition in which the solid phase and the gas phase can coexist. The density value is about 0.5% to 80% of the atomic density $1.6 \times 10^{22}/cm^3$ of solid Xe, which can be derived from the mass density 3.5 g/cm$^3$ of solid Xe, the atomic mass number of 131.3 of Xe and the Avogadro's number $6.02 \times 10^{23}$. Therefore, when this target is irradiated with a YAG laser beam, for example, the target is heated and ionized, so that plasma having an ion density of $2 \times 10^{20}$ to $8 \times 10^{21}/cm^3$ and an electron density of $10^{20}$ to $10^{23}/cm^3$ is generated. The reason why the upper limit of the electron density is about 10 times as high as that of the ion density is that one ion generates 10 to 15 electrons. The reason why the lower limit thereof is not 10 times is that the heated plasma quickly expands. Thus-generated plasma emits the extreme ultraviolet light having a wavelength of 13 to 14 nm. Since the density of the entire target is slightly smaller than the critical density at which the fundamental wavelength light of the YAG laser, for example, can be absorbed, at an extreme ultraviolet light emission temperature, light is emitted with high efficiency, near to the emission limit, corresponding to the black radiation. Since, according to the system of the present embodiment, no part which does not contribute to the emission is needlessly heated, energy loss can be minimized and debris is prevented from being generated.

Figure 6:
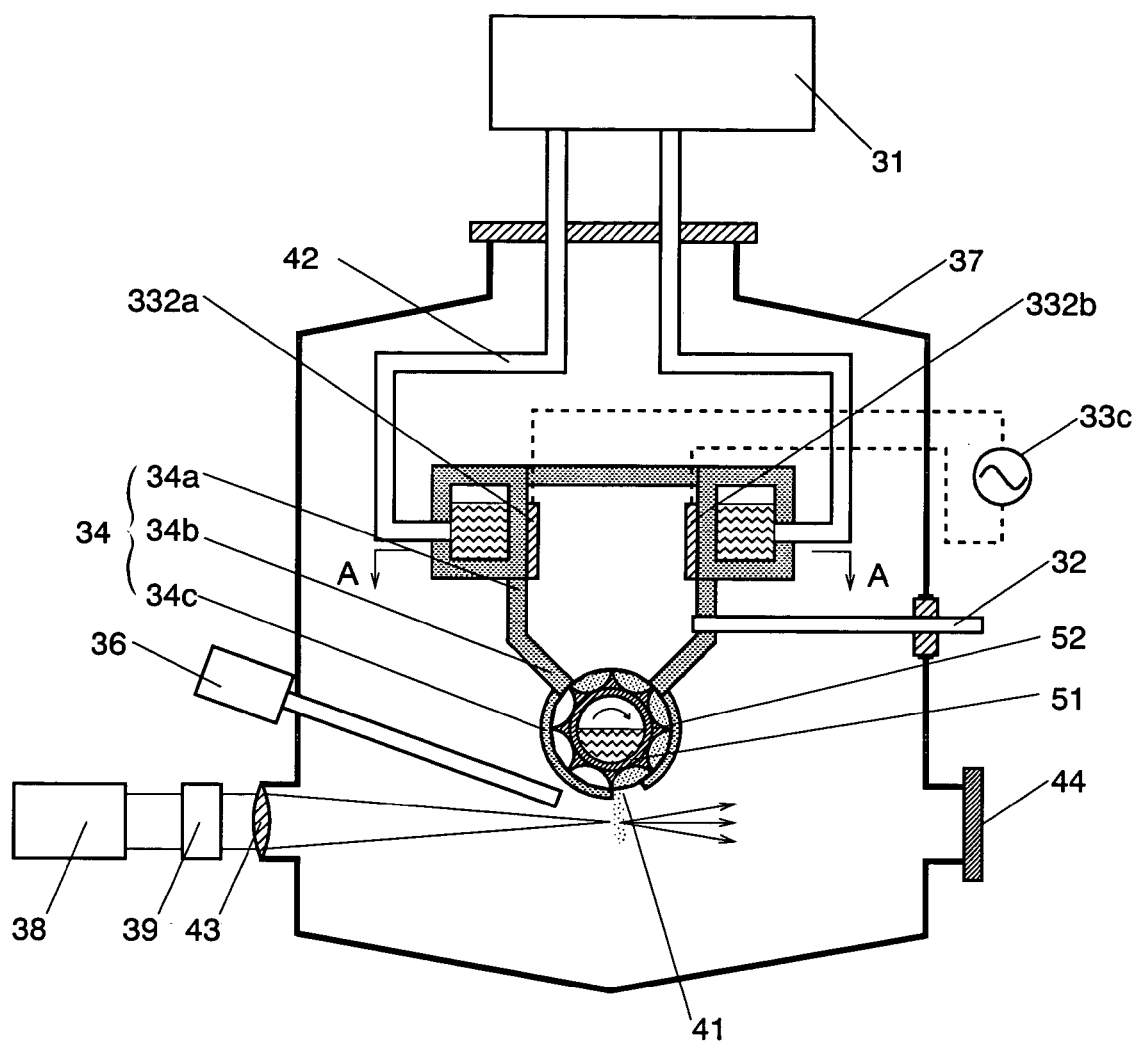
FIG. 6 is a vertical sectional view showing a second embodiment of an extreme ultraviolet light source using an extreme ultraviolet light source target according to a second aspect of the present invention.

FIG. 6 is a vertical sectional view showing an extreme ultraviolet light generating system using the target made of the frost in the second aspect according to a second embodiment. FIG. 7 is a sectional view taken along line A-A in FIG. 6.

The system includes a freezing machine 31, a gas injection pipe 32, a heater 33, a hopper 34, a monitor 36, a vacuum chamber 37, a high-output pulse laser beam generator 38 and a wavelength converter 39, and the components other than the heater 33 and the hopper 34 are the same as those in the extreme ultraviolet light generating system according to the first embodiment. In addition to the above components, a bladed wheel 51 is provided in the present embodiment. Only the bladed wheel, the heater 33 and the hopper 34 will be described hereinafter.

The heater 33 has three pairs of discharge electrodes 331*a*-331*b*, 332*a*-332*b* and 333*a*-333*b*, and they are fixed to a wall surface of a body part 34*a* of the hopper 4 so that the discharge electrodes 331*a* and 331*b*, 332*a* and 332*b*, and 333*a* and 333*b* are opposed, respectively.

The hopper 34 integrally comprises a cylindrical housing 34*c* which intersects with the body 34*a* at right angles, under a guide part 34*b* and an outlet 41 is provided at a lower end of the housing 34*c*. The bladed wheel 51 is rotatably fixed in the housing 34*c*, being concentric with the housing 34*c*, and has a plurality of blades (eight in the drawing) 52 radiating outward. The tip ends of the blade 52 are set close to the inner peripheral surface with a small distance. The same cooling material as that circulating around the body part 34*a* circulates in the center of the bladed wheel 51.

According to this system, while one pair of discharge electrodes (331*a* and 331*b*, for example) is energized to generate vapor from a solidified layer like the above embodiment, the rest of the discharge electrodes are stopped and injection gas is cooled and solidified to form a new solidified layer. Thus, frost can be continuously generated. The generated frost is deposited between blades 52, and, as the bladed wheel 51 is rotated, the frost at the outlet 41 is discharged from the outlet 41 with an appropriate amount. Similar to the above embodiment, extreme ultraviolet light is generated when the discharged frost is irradiated with a laser beam.

The invention claimed is:

1. An extreme ultraviolet light source comprising an extreme ultraviolet light source target made of a gel containing heavy metal or heavy-metal compound, and a density of the heavy metal or the heavy-metal compound is 0.5% to 80% of the density of a crystal of the heavy metal or the heavy-metal compound.

2. The extreme ultraviolet light source according to claim 1, wherein the heavy metal is selected from the group consisting of Ge, Zr, Mo, Ag, Sn, La, Gd and W, and wherein the heavy-metal compound comprises a heavy metal selected from the group consisting of Ge, Zr, Mo, Ag, Sn, La, Gd and W.

3. The extreme ultraviolet light source according to claim 2, wherein the heavy metal is Sn or the heavy-metal compound is SnO2.

4. The extreme ultraviolet light source according to claim 1, wherein the target is shaped as a tape.

5. A method of generating extreme ultraviolet light, comprising irradiating the extreme ultraviolet light source target according to claim 1 with a laser beam.

6. An extreme ultraviolet light source according to claim 1, further comprising a laser light source irradiating the target with a laser beam.

7. The extreme ultraviolet light source according to claim 6, wherein the laser light source is a light source which emits a fundamental wave or a harmonic wave of YAG laser or excimer laser.

8. The extreme ultraviolet light source according to claim 1, wherein the extreme ultraviolet light source target is an aerogel body of heavy metal or heavy-metal compound.

9. An extreme ultraviolet light source comprising:
   a hopper having an outlet from which frost can be discharged;
   a freezing machine for cooling the hopper;
   a heater which can heat a wall of the hopper intermittently; and
   a vacuum chamber for keeping around the hopper in a vacuum state and having a first window for guiding a laser beam from the outside to the vicinity of the outlet, and a second window for taking out extreme ultraviolet light.

10. The extreme ultraviolet light source according to claim 9, wherein the heater works with the principle of high-frequency discharge.

11. The extreme ultraviolet light source according to claim 10, wherein a plurality of discharge electrodes of the heater are provided in an outer circumference of the hopper.

12. The extreme ultraviolet light source according to claim 9, wherein the extreme ultraviolet light source further comprises a bladed wheel having a plurality of blades radiating outward and rotatably fixed to the hopper just above the outlet, and in that the hopper is formed cylindrically just above the outlet so as to surround the bladed wheel.

13. A method of generating extreme ultraviolet light, comprising the steps of:
   manufacturing an extreme ultraviolet light source target, wherein a density of the heavy-metal oxide of the target is made to be 0.5% to 80% of the density of a heavy-metal oxide crystal, with a process comprising:
   manufacturing a gel containing a heavy-metal oxide by solving a heavy-metal chloride in dehydrated alcohol and mixing this with water;
   drying the gel; and
   irradiating the extreme ultraviolet light source target with a laser beam.

14. The method of generating extreme ultraviolet light according to claim 13, wherein the heavy-metal chloride is $SnCl_4$.

15. A method of generating extreme ultraviolet light, comprising the steps of:
   manufacturing an extreme ultraviolet light source target, wherein a density of the heavy-metal oxide of the target is made to be 0.5% to 80% of the density of a heavy-metal oxide crystal with a process comprising:
   manufacturing a gel containing a heavy-metal oxide by solving a heavy-metal chloride in dehydrated alcohol and mixing this with water;
   forming a target by mixing the gel with nanoparticles of polystyrene and heating the gel to a temperature which is 240° C. or more but below a decomposition temperature of the heavy-metal oxide; and
   irradiating the extreme ultraviolet light source target with a laser beam.

16. The method of generating extreme ultraviolet light according to claim 15, wherein the heavy-metal chloride is $SnCl_4$.

* * * * *